United States Patent [19]

Parkinson

[11] 4,441,125

[45] Apr. 3, 1984

[54] IMAGE SENSOR USING DYNAMIC RANDOM ACCESS MEMORY

[75] Inventor: Ward D. Parkinson, Boise, Id.

[73] Assignee: Micron Technology, Inc., Boise, Id.

[21] Appl. No.: 317,876

[22] Filed: Nov. 3, 1981

[51] Int. Cl.³ .............................................. H04N 3/14
[52] U.S. Cl. .................................................. 358/213
[58] Field of Search ........................................ 358/213

[56] References Cited

U.S. PATENT DOCUMENTS 4,131,919 12/1978 Lloyd et al. ......................... 358/213
4,254,433 3/1981 Dewar, Jr. et al. ................. 358/213
4,344,091 8/1982 Gardner et al. .................... 358/213

Primary Examiner—Richard Murray
Attorney, Agent, or Firm—Arnold, White & Durkee

[57] ABSTRACT

A new and improved solid-state image sensor uses a dynamic random access memory as the light sensitive element. The dynamic random access memory is mounted in a semiconductor package having a transparent lid, and one or more lenses focuses the light image onto the dynamic random access memory. A recording device or a display unit is provided. The new and improved solid-state sensor is particularly useful in low-cost applications, such as robots and toys.

11 Claims, 6 Drawing Figures

IMAGE SENSOR USING DYNAMIC RANDOM ACCESS MEMORY

BACKGROUND OF THE INVENTION

The present invention relates generally to image sensors and more particularly relates to image sensors using the light sensitive storage cells of a dynamic random access memory.

An image sensor is a transducer which is responsive to a light image for producing a signal or other indicia which to some extent characterizes or reproduces the light image. One type of image sensor which is now well-known, is the so-called vidicon tube. The vidicon tube is a vacuum tube which is responsive to light to produce electrical signals which reproduce the pattern of light impinging upon the vidicon. As technology has advanced, the vidicon tube has proven to be too bulky and too expensive for many applications.

With the arrival of the age of the semiconductor and solid-state technology, solid-state devices have been devised to replace the vidicon tube for use as image sensors. Solid-state image sensors employing photodiode arrays, charged coupled devices and charge-injection devices are all now known. These techniques employ a silicon semiconductor chip operating according to the so-called photoelectric effect for reproducing light images impinging upon the chip. These solid state imagers are able to reproduce an image with good quality and high resolution at a fraction of the weight and area of a vidicon tube with "solid state" reliability. A general description of such solid-state image sensors and their expected applications is found in FORTUNE, Aug. 10, 1981, pages 161–164.

However, there are many low cost applications for image sensors which remain not withstanding the development of the described solid-state image sensors. In some applications high resolution is unnecessary, and the present day solid state image sensors which are designed to provide such resolution are unacceptably expensive for many consumer applications. Resolution is helpful for position and area measurement and display acuity.

As the described solid-state techniques of charged coupled devices, charge injection devices, and photodiodes were developing, other semiconductor fields also were developing. One such field is the integrated circuit field in general and the integrated circuit memory field in particular. The field of integrated circuit memories has become particularly well developed because of the relatively high unit and total dollar volume. The enormous growth of computer memories has been a primary motivation for the continued refinement and development of semiconductor memories.

One such type of semiconductor memory which is known by those in the art to be light sensitive is the so-called dynamic random access memory (hereinafter dynamic RAM). Dynamic RAMs are generally characterized as employing an array of memory cells, each memory cell having a storage capacitor and access transistor. The array of storage cells are fabricated on semiconductor chips of various, evolving bit densities, such as 1K, 4K, 16K, and more recently 64K or 65,536 bits per chip. The architecture of these chips to achieve, for example, the 64K by 1 product varies from a 2 array to an 8 array characterized by the number of blocks of contiguous memory cells accurately positioned in matrices. Each of the memory cells has a storage capacitor which is light sensitive, the 2 array offers the greatest contiguous number of elements or possible resolution.

Each memory cell may be randomly accessed by, for example, 16 address bits furnished to the chip by the user. Each memory cell must be refreshed by accessing it at least every prescribed interval of time, for example 2 milliseconds, to assure that the memory capacitor has not excessively leaked away charge which determines the state of the memory cell. The predominant leakage mechanism is diffusion current to substrate. This current is composed of so-called dark current, such as generation-recombination current, in the space charge region across the PN junction normally present in forming the memory capacitor. Additionally, photo current which is proportional to the light impinging on the cell capacitor diffusion area is also present. Both of these currents combine to discharge the cell from a charged (i.e. logic 1) level to a discharged or logic 0 level. Because of this gradual decay of the charge level in the memory capacitor, the memory must be refreshed periodically to assure the integrity of the data in the memory cell.

This refreshing action characterizes dynamic RAMs in that each cell must be refreshed periodically; i.e. the true contents of the given memory capacitors must be written back into the respective memory capacitors to recharge the cell.

The magnitude of the photocurrent is proportional to light impinging on the cell capacitors. Thus, if the amount of light varies, the photocurrent varies and performance of the dynamic RAM becomes less predictable. Accordingly the characteristic that dynamic RAMs are light sensitive has heretofore been considered to be a negative or adverse characteristic. Semiconductor manufacturers customarily take precautions to restrict the amount of light impinging upon the memory cell to minimize this photocurrent. For example, during wafer probe testing of the dynamic RAM, a black cloth is customarily placed around the test equipment to shield light from the device under test. Thereafter, the dynamic RAM chips which pass the testing requirements are packaged in light-tight, opaque black packages.

Many prior dynamic RAM chips employed sense amplifiers which utilized a so-called dummy cell. The dummy cell typically took the form of a replica of one of the memory cells or a portion thereof, such as one-half a memory cell. Because such a dummy cell was used in generating a threshold to a sense amplifier which sensed the charge level of the memory cell against a threshold, the sense amplifier/threshold generator circuitry also was light sensitive. Thus, the light image impinging on the random access memory system would not only alter the data states of the memory cells, but would also alter functioning of the sense amplifier/threshold generator.

Improvements in high density random access memory systems were made. One such improvement eliminated the so-called dummy cell in the threshold generator/sense amplifier. This improvement used a dynamic-/active/restore sense amplifier employing the so-called mid-point digit line. This technique is generally described in Foss, "Dynamic Memories," ISSCC Digests of Technical Papers, pages 140–141, 1979. Also, such advances are shown in pending patent application Ser. No. 179,581, entitled Dynamic Random Access Memory, filed on Aug. 21, 1980, in the names of Dennis R.

Wilson and Robert J. Proebsting, now U.S. Pat. No. 4,397,002, issued Aug. 2, 1983, and in U.S. Pat. No. 4,291,392 entitled Timing of Active Pullup For Dynamic Semiconductor Memory, issued Sept. 22, 1981 to Robert J. Proebsting which is hereby incorporated by reference.

Historically, in the manufacture of dynamic RAMs, numerous chips which are only partially defective result from the sophisticated manufacturing process. Partially defective chips are those having a less than prescribed number of acceptably functioning memory cells in a given array. These partially defective (or conversely partially good) chips presently are either discarded or sold at considerably reduced prices.

SUMMARY OF THE INVENTION

The present invention provides a new and improved solid-state image sensor employing a dynamic random access memory to provide an image sensor which is low cost, yet capable of high resolution and which can utilize partially defective dynamic random access memory chips in low cost applications.

According to one aspect of the present invention, the solid-state image sensor comprises a dynamic random access memory system having one or more arrays of dynamic random access memory cells. One or more lenses are provided to direct a light image onto the dynamic random access memory system. The light image alters the data states of the memory cells, and the altered data states are representative of the light image.

Preferably the dynamic random access memory system has one or more sense amplifiers for comparing the data states of the memory cells to a threshold value. A threshold generator provides a relatively stable (light insensitive) threshold value to the one or more sense amplifiers (without requiring a light sensitive memory capacitor). Circuitry is provided for refreshing and writing into and reading from the memory cells to enable the writing out a signal indicative of the data states of the memory cells as the data states are altered in response to the light image conventional to dynamic RAM.

According to another aspect of the invention, the dynamic random access memory system is supported in a package which defines a substantially transparent portion in relation to the memory cells to allow the image to pass through the portion onto the memory cells. The package is adapted to support the one or more lenses.

According to another aspect of the invention, the random access memory system includes an equilibrate terminal which is coupled to the threshold generator. This allows altering of the threshold value provided to the one or more sense amplifiers, thereby to allow adjustment of the sensitivity of the image sensor so it may work at varying light levels, same scan rate. Alternately, the scan rate may be altered. Either of these means allow generation of "shades of gray" by, in a preferred means, scanning the chip with threshold generator sequentially (per pass) at 1V, 2V, 3V, 1V, 2V, 3V, etc.

According to other aspects of the invention, a recorder is coupled to the dynamic random access memory system employed as an image sensor for recording the data states of the memory cells which are altered by the light image, thereby recording a replica of the visual image.

According to yet another aspect of the invention, an optical display is provided in combination with the dynamic random access memory system employed as an image sensor. The optical display produces an image in response to the contents of the altered memory cells, thereby to display a reproduction of the light image.

In yet another embodiment of the invention, the new and improved solid-state image sensor employing dynamic rams is incorporated into a toy. A solid-state sensor employing dynamic rams is supported on a body for the toy, and means are provided for moving the body in reponse to operation of the solid-state sensor.

Accordingly, it is a general object of the present invention to provide a new and improved solid-state image sensor employing dynamic random access memories.

The above noted and other objects and advantages of the present invention will become more apparent from a reading of a detailed description of a preferred embodiment when read in conjunction with the appended drawings.

BRIEF DESCRIPTION OF THE DRAWINGS

FIG. 4 is a functional block diagram including a recording system and a display system for the inventive solid-state image sensor employing dynamic random access memory; and FIG. 5 is a schematic of a toy version of a robot embodying the new and improved image sensor employing dynamic RAM.

DESCRIPTION OF A PREFERRED EMBODIMENT

Figure 1A:
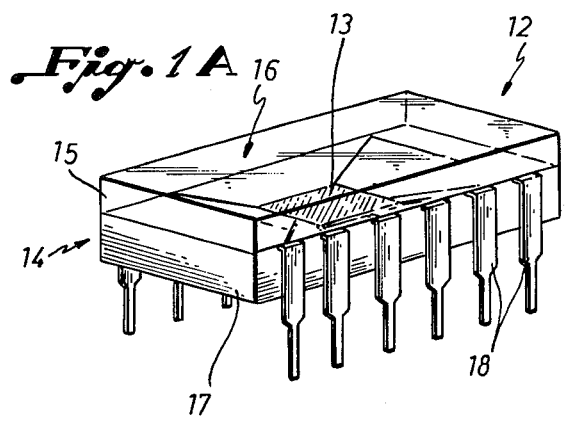
FIG. 1a depicts a packaged dynamic RAM in accordance with one aspect of the present invention.
Figure 1B:
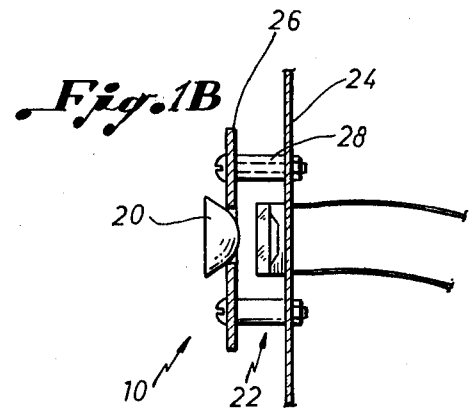
FIG. 1b schematically depicts the packaged dynamic RAM of FIG. 1a having a lens positioned with respect thereto.

Referring now to FIGS. 1a and 1b, a new and improved solid-state image sensor 10 is constructed and arranged according to the invention to provide a low cost image sensor capable of high resolution. The image sensor 10 includes a dynamic random access memory (dynamic RAM) system 12, including semiconductor chip 13, supported within a semiconductor package 14. In the preferred and illustrated embodiment, the package 14 includes a top 15 having a clear or transparent portion 16. Although shown in FIG. 1a as being substantially the entirety of the top 15, the clear portion 16 could suitably comprise a portion substantially less than the entirety of the top 15.

Except for the clear portion 16, the package 14 is conventional. It includes a solid, clear or opaque base 17 having sixteen pins 18 extending therefrom for electrical interconnection to the RAM system 12. The chip 13 is mounted in the base 17 in a conventional manner and is bonded to the pins 18 in a conventional manner.

The image sensor 10 also includes one or more lenses 20. The lens 20 shown in FIG. 1b is supported in relationship to the package 14 and thus to the RAM system 12 by a support structure 22. In the preferred and illustrated embodiment, the support structure 22 includes a printed circuit board 24 on which the package 14 is mounted. The lens 20 is secured to a bracket 26 which in turn is mounted to the board 24 by a set of screws 28. The lens 20, the portion 16, and the RAM system 12 are maintained in a particular relationship. That is, the RAM system 12 underlies the clear portion 16, and the lens 20 is supported to overlie the clear portion 16 so that light passing through the lens will be focused onto the RAM system 12. Preferably the lens 20 is a so-called fish eye lens having a large width of field. This assures that light images from all distances from the sensor 10 will be focused by the lens 20 onto the RAM system 12.

As used herein the term light is understood to mean radiation not only in the visible spectrum but also in the infrared and ultraviolet spectra, filtered or unfiltered.

Figure 2:
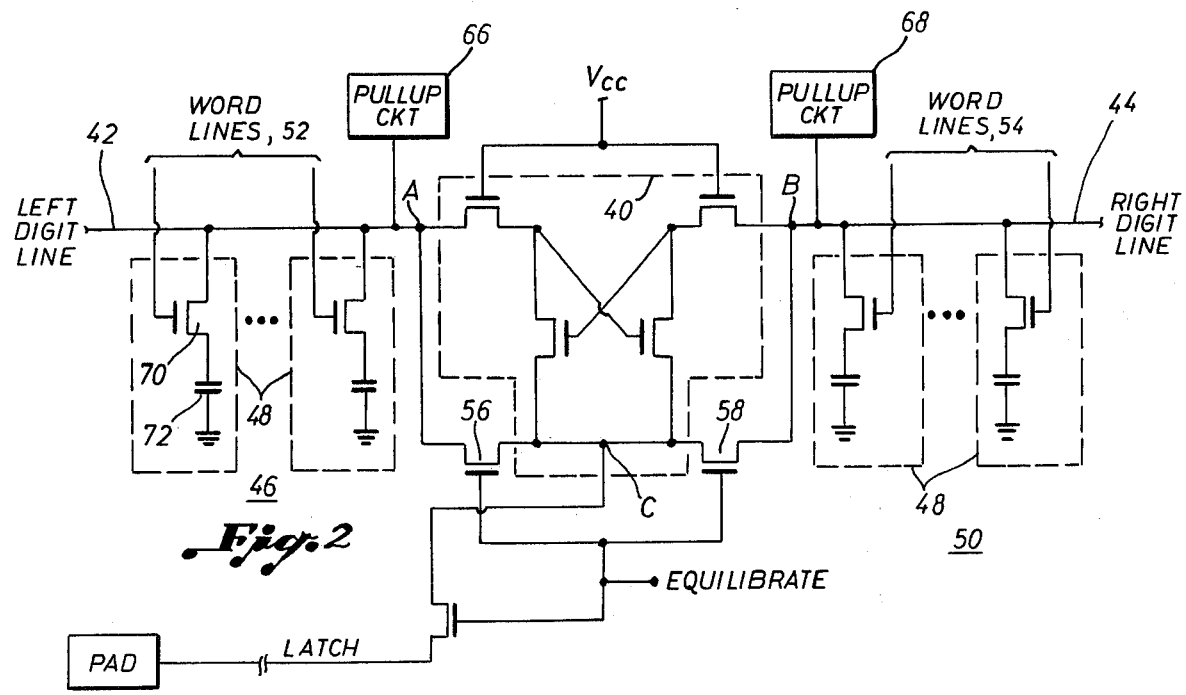
FIG. 2 is a circuit schematic for the dynamic random access memory depicted in FIG. 1.

A preferred embodiment of the RAM system 12 is shown by the generalized circuit schematic of FIG. 2. The RAM system 12 as shown in FIG. 2 is now conventional but is of a certain class which is particularly adapted for the present invention. In particular, the preferred RAM system 12 is of the type embodying associated peripheral interface, drive, and cell threshold/sense amplifier circuitry which is relatively light insensitive compared to the memory cells in the RAM. For example, the RAM system 12 employed in the invention may be of the type employing a dynamic/active/restore sense amplifier as described in the aforementioned Foss article and described in the referenced Wilson and Proebsting application. In these systems, the RAM system 12 does not employ a socalled dummy cell as a threshold generator.

These so-called dummy cells, because typically they are of a smaller size than the memory cells of the RAM, are relatively more light sensitive than the memory cells of the RAM. Further, because the light sensitive dummy cells historically have been placed on the periphery of the chip, they can collect more light, further compounding the problems in using such a device in accordance with the present invention.

Referring now to FIG. 2 the random access memory system 12 which is particularly suited for the present invention is shown. A commercial embodiment which is suitable as the RAM system 12 is the MK4164 64K RAM manufactured and sold by Mostek Corporation.

According to FIG. 2 a sense amplifier 40 is provided and preferably takes the form of any of several known cross coupled MOSFET detector circuits. The sense amplifier 40 has nodes A, B respectively which are coupled to the left digit line 42 and to the right digit line 44. A first array 46 of memory cells 48 is coupled to the left digit line 42, and a second array 50 of similar memory cells 48 is coupled to the right digit line 44. A set of word lines 52 is coupled to the array 46 for selectively addressing the memory cells 48 in the array 46. Another set of word lines 54 is coupled to the array 50 for selectively addressing the memory cells 48 in that array.

A pair of equilibrate transistors 56, 58 selectively couple the respective digit lines together to allow equalization of the digit lines at the end of a refresh cycle and during the precharge stage of the next cycle.

The common drains of the cross-coupled sense amplifier transistors, represented as node C, are connected through an isolation transistor 60 to a pad 62 on the periphery of the integrated circuit chip 13. The pad 62 is thereupon bonded to one of the leads 18 of the package 14, preferably pin 1.

A pair of pull-up circuits 66, 68 respectfully are coupled to the nodes A, B. The pull-up circuits 66, 68 are voltage divider circuits operable to control the voltage level of the digit lines 42, 44 as will be explained.

As seen in FIG. 2, each of the memory cells 48 includes an access transistor 70 and a memory capacitor 72. Whenever the appropriate word line 52, 54 enables the access transistor 70, the memory capacitor 72 is either written into for restoring or altering the data state or the memory capacitor is read from; i.e. has its data state read for determination as either a logic 1 or logic 0 level. As will be explained hereafter, as a light image is focused onto the RAM system 12, the storage capacitors 72 selectively discharge in accordance with the intensity of the light image. Writing out the charge states of the memory capacitors 72 provides an indication of the light image impinging upon the RAM system 12.

Figure 3:
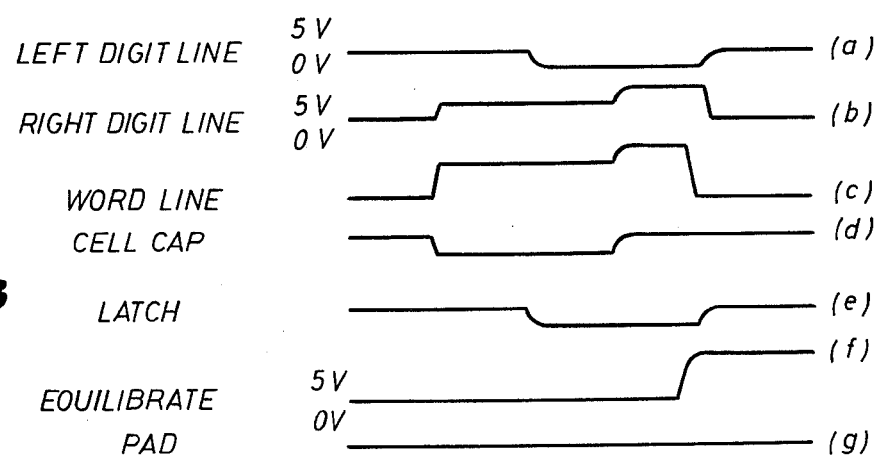
FIG. 3 is a timing diagram showing typical waveforms for the circuit schematic of FIG. 2.

The operation of the illustrated RAM system 12 is shown in FIG. 3. A given word line 52, 54 (FIG. 3C) is brought to a logic 1 level to enable the addressed access transistor 70. The respective cell capacitor 72 (shown to be a logic 1 in FIG. 3C) is discharged onto the digit line (shown to be the right digit line in FIG. 3B) changing its value above the equalized value. Then, a latch signal from the pad 62 becomes a logic low state to enable operation of the cross coupled transistors and the sense amplifier 40 during absence of the equilibrate signal. The sense amplifier 40 responds to the latch signal by reducing the left digit line to a ground potential. The digit lines are connected by input/output circuitry (not shown), which provides a digital signal representing the content of the selected memory capacitor 72. The pull-up circuits cause the right digit line to be pulled up to the level of the supply voltage. At approximately this time, the storage capacitor 72 which had been connected to the bit line has been restored to its original logic 1 state.

The word line FIG. 3C is then returned to ground to isolate the charge in the respective memory cells 48. The digit lines are then permitted to go low, and the equilibration signal becomes a logic 1 to render the equilibrate transistors 56, 58 conductive to allow the digit lines to be connected for equalization. This permits the charge on the bit lines 42, 44 to be shared such that the bit lines equilibrate to a voltage approximately halfway between the supply voltage and ground. A new cycle is thereupon ready to commence.

As shown in FIG. 3G, the latch signal is placed on the pad 62 such that during the equilibrate signal, a voltage potential may be applied to the digit lines when they are connected to effect equilibrium. As will become apparent, the voltage which is applied to the pad 62 allows adjustment to the sensitivity of the image sensor according to the invention. In particular, the digit line potential (for example 2.2 volts) acts as a threshold to determine if the particular memory cell 48 is at a 5 volt or 0 volt level. By raising the potential, the cells may leak less before they are considered to be decayed from a logic 1 to a logic 0 value. Hence, the particular memory cells can be considered to be more light sensitive.

An alternate method of operating the RAM system 12 as an image sensor is to read the storage cells 48 less frequently so that they see the image longer. For example, if the array is serially read using a 1 microsecond period, every cell is read every 0.065 seconds. This means that approximately 15.4 times per second the cell is exposed to the image, reset to 5 volts, allowed to decay for 0.065 seconds. Then as a function of the light on it, it is read out as a logic 1 (not enough light on that cell to discharge it) or as a logic 0 (enough light to reduce the cell from 5 volts to at least 2.2 volts or less). By extending the chip READ period to 10 microseconds so that it takes 0.65 seconds to scan the whole array before returning to a given memory cell 48, the image impinges upon a given cell 10 times longer, and the light intensity may be 1/10th that of the value previously necessary to lower a memory cell from a logic 1 to a logic 0.

Figures 4, 5:
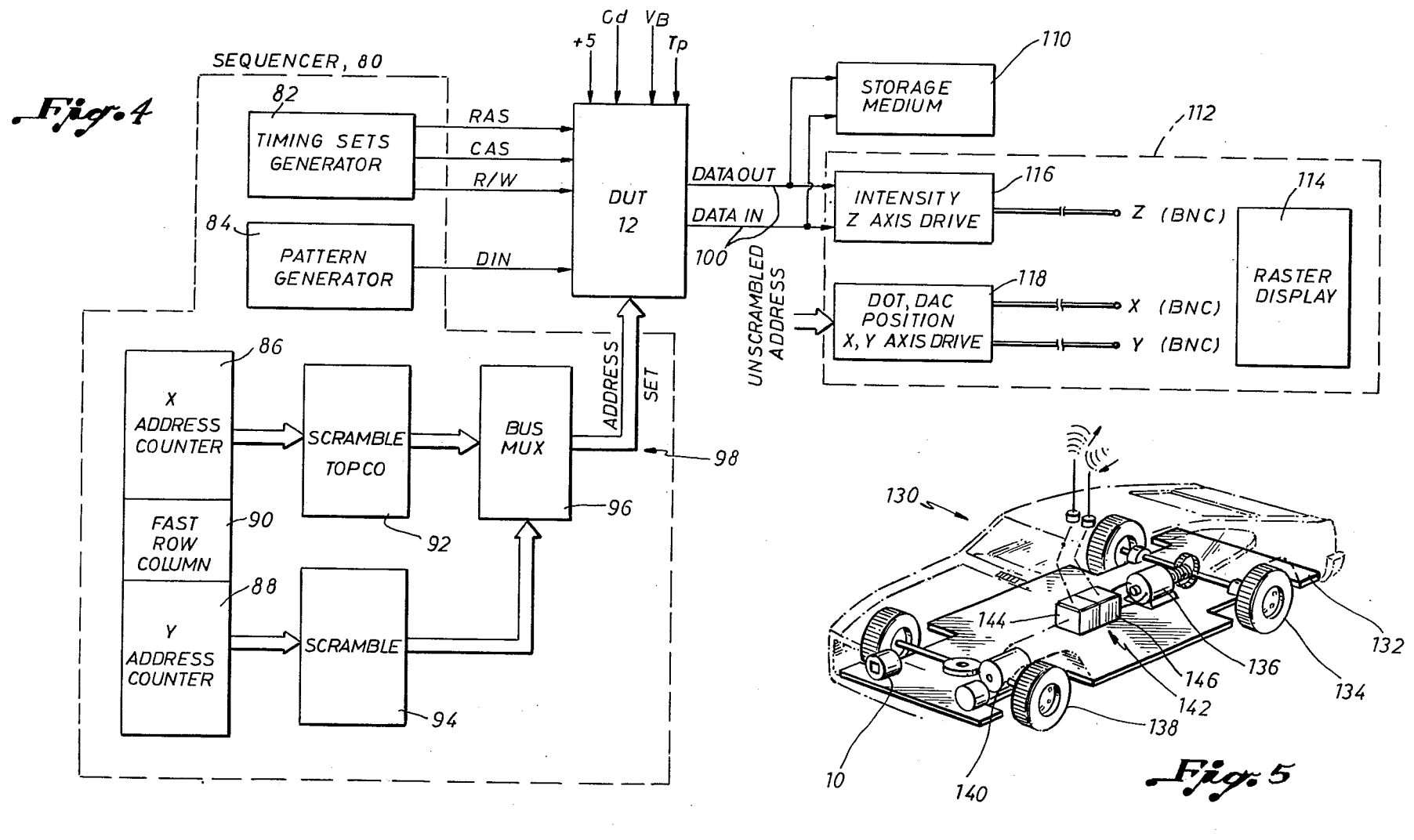

Referring now to FIG. 4, a sequencer 80 is shown for operating the RAM system 12 according to the invention. The sequencer 80 may take the form of a Terradyne J387A or equivalent memory tester. FIG. 4 is a functional block diagram to explain one suitable sequencer 80.

The sequencer 80 includes a timing generator 82 and a pattern generator 84. The timing generator 82 is connected to the RAM system 12 to produce the appropriate timing signals, including the Read/Write signal (R/W), the Column Address Strobe signal (the CAS signal) and the Row Address Strobe (RAS) signal.

The pattern generator 84 produces a pattern which allows sequential reading of the memory cells 48 on the Data out pin of the RAM memory 12.

The sequencer 80 also includes circuitry for providing the addresses necessary to address the various memory cells 48. A pair of X and Y address registers, 86, 88 respectively are provided. The registers 86, 88 are coupled by a fast column/slow row sequencer 90. The respective outputs of the counters 86, 88 are scrambled by scramblers 92, 94 which in turn are multiplexed onto a bus 96. The multiplex bus 96 communicates the address signals to the RAM system 12 via the address inputs 98.

The above drive electronics may be mounted on the printed circuit board 24 (FIG. 1b) or may be supported remote therefrom. The output of the image sensor is via the data outline 100 (FIG. 4). The output from the image sensor is thereupon communicated to either a storage medium 110 for storing the image sensor output or to a display unit 112. The storage medium 110 may be magnetic tape, computer paper, semiconductor memory, or other such storage devices. The data output signal is a digital representation of the light image impinging upon the RAM system 12.

The display unit 112 includes a raster type display, such as a Tektronix model 604A oscilloscope 114 and associated Z axis drive circuitry 116 and X, Y axis drive circuitry 118. The data from the image sensor is provided to the Z axis drive circuitry 116, and the unscrambled address from the registers 86, 88 is provided to the X, Y axis drive circuitry 118. The X, Y axis drive circuitry 118 controls the position of the dot on the raster type display 114, and is a digital-to-analog converter.

In operation, the optical image is focused onto the RAM system 12 via the lens 20. The various memory cells 48 are selectively discharged in response to the light image, and when the memory cells are serially scanned, the output coherently replicates the image on the display 114.

Generally, the output from the RAM system 12 is digitized into a two level (or black and white type) signal. To produce shades of gray, the memory cells 48 may be scanned with the latch signal forced to a repeating sequence of 1, 2, and 3 volts. If the individual cell is discharged for all three cases, the cell is receiving (or seeing) more light than a cell that is discharged only at 3 volts or at 2 and 3 volts. The display 114 can average the output from the RAM system 12 so that shading may be represented. The so-called averaging on the display (or in a computer which may receive the data such as in the storage medium 110) can take the form of dots on the display being illuminated more or less frequently, and being more or less bright, resulting in so-called shades of gray.

Alternately, but with the same effect, the arrays 46, 48 may be scanned at various rates (periods).

The above described image sensor is particularly useful in low cost applications. One such application is in robot applications, such as industrial processing and toys. In industrial applications, the low cost image sensor described herein is particularly useful as a position indicator; i.e. merely to detect when an object under consideration has reached a particular location or position. FIG. 5 illustrates one use of the solid-state image sensor employed according to the invention to control a robot which takes the form of a toy car 130.

The toy car 130 includes a conventional toy structure 132 having rear wheels 134 electrically driven by a motor 136. Front wheels 138 are steerable, and are controlled by an electrically operated steering mechanism 140.

According to this aspect of the invention, the above described image sensor 10 is supported on the front of the toy car 130 and has its output coupled to a control circuit 142. The control circuit 142 is suitably designed to actuate or deactuate the electric motor 136 for starting and stopping the toy car 130 and to control the angles of the wheel 138 by controlling operation of the motor 140.

Preferably the control circuit 142 includes a transmitter section 144 and a receiver section 146. The transmitter section transmits the electrical signals from the image sensor 10 to a remote location where they are processed into the video image by a system equivalent to that shown in FIG. 4. Thereupon, a human operator, or a computer, who analyzes the reconstructed video image, transmits the appropriate instruction back to the section 146 for controlling the car 130.

Other applications will be readily apparent due to the low cost nature of the described image sensor. Depending on the degree of resolution required for the particular application, less than perfect random access memory chips which had been previously discarded may be reclaimed for the particular application. And, as the price of solid-state electronics continues its decline, the already inexpensive solid-state imager herein described will become even more inexpensive.

Although rather detailed embodiments of the invention have been described herein, it will be understood that they have been given by way of example only. Other embodiments within the spirit and scope of the invention will be readily apparent.

What is claimed is:

1. A solid state image sensor comprising:
(a) a dynamic random access memory system having one or more arrays of dynamic random access memory cells adapted to have at least two data states, said memory cells including one or more MOSFETs, one or more sense amplifiers for comparing the data states of the memory cells to a threshold value, a dummy-cell-capacitor free threshold generator for providing a relatively light-stable threshold value to the one or more sense amplifiers, means for refreshing the memory cells to restore the data states, and means coupled to the one or more sense amplifiers for writing out an indication of the data states of the memory cells; and (b) one or more lenses for directing and focusing a light image onto said dynamic random access memory cells thereby to alter the data states of the memory cells in response to the light image.

2. The image sensor according to claim 1 and including a package for supporting the dynamic random access memory system, said package defining a substantially transparent portion in relation to the memory cells to allow said image to pass through said portion onto said memory cells.

3. The image sensor according to claim 2 and including means supporting said one or more lenses on said package.

4. The image sensor according to claim 1 and including means coupled to said threshold generator for altering the threshold value provided to the one or more sense amplifiers.

5. The image sensor according to claim 1 wherein each of said memory cells includes a radiation sensitive capacitor and a MOSFET gating device to allow the capacitor to be selectively charged and to be selectively discharged in response to said light image.

6. The solid state image sensor according to claim 1, wherein the memory system includes first and second digit lines coupled to the respective sense amplifier, and wherein said threshold generator further includes equalizing means for equalizing the voltage levels on said digit lines, thereby establishing said threshold value.

7. An image recorder comprising:
(a) a dynamic random access memory system having one or more arrays of dynamic random access memory cells adapted to have at least two data states, one or more sense amplifiers for comparing the data states of the memory cells to a threshold value, a dummy-cell capacitor free threshold generator for providing a relatively light-stable threshold value to the one or more sense amplifiers, means for refreshing the memory cells to restore the data states, and means coupled to the one or more sense amplifiers for writing out an indication of the data states of the memory cells;
(b) one or more lenses for directing a light image onto said dynamic random access memory cells thereby to alter the data states of the memory cells in response to the light image; and
(c) means coupled to the dynamic random access memory system for recording the data state indications thereby recording a replica of said visual image.

8. A camera for reproducing a light image comprising:
(a) a dynamic random access memory system having one or more arrays of dynamic random access memory cells adapted to have at least two data states, one or more sense amplifiers for comparing the data states of the memory cells to a threshold value, a dummy-cell capacitor free threshold generator for providing a relatively light-stable threshold value to the one or more sense amplifiers, means for refreshing the memory cells to restore the data states, and means coupled to the one or more sense amplifiers for writing out an indication of the data states of the memory cells; and
(b) one or more lenses for directing a light image onto said dynamic random access memory cells thereby to alter the data states of the memory cells in response to the light image; and
(c) means coupled to the dynamic random access memory system for optically displaying a reproduction of said light image.

9. A light controlled robot comprising:
(a) a body;
(b) a solid-state sensor supported on said body;
(c) means for moving said body in response to operation of said solid state sensor; wherein said solid state sensor includes;
(i) a dynamic random access memory system having one or more arrays of dynamic random access memory cells adapted to have at least two data states, one or more sense amplifiers for comparing the data states of the memory cells to a threshold value, a dummy-cell capacitor free threshold generator for providing a relatively light-stable threshold value to the one or more sense amplifiers, means for refreshing the memory cells to restore the data states, and means coupled to the one or more sense amplifiers for writing out an indication of the data states of the memory cells; and
(ii) one or more lenses for directing a light image onto said dynamic random access memory cells thereby to alter the data states of the memory cells in response to the light image.

10. The light controlled robot according to claim 9 wherein said means for moving includes:
(a) a transmitter supported from said body and coupled to receive and transmit said indication of data states and
(b) a receiver supported from said body for controlling movement of said body in response to signals transmitted remote from said body.

11. A solid state image sensor comprising:
(a) a dynamic random access memory system having one or more arrays of dynamic random access memory cells adapted to have at least two data states, one or more sense amplifiers for comparing the data states of the memory cells to a threshold value, a dummy-cell-capacitor free threshold generator for providing a relatively light-stable threshold value to the one or more sense amplifiers, said threshold generator including a voltage divider circuit which eliminates the need for the capacitance of a memory cell, means for refreshing the memory cells to restore the data states, and means coupled to the one or more sense amplifiers for writing out an indication of the data states of the memory cells; and
(b) one or more lenses for directing and focusing a light image onto said dynamic random access memory cells thereby to alter the data states of the memory cells in response to the light image.

* * * * *

UNITED STATES PATENT AND TRADEMARK OFFICE
CERTIFICATE OF CORRECTION

PATENT NO. : 4,441,125
DATED : April 3, 1984
INVENTOR(S) : Ward D. Parkinson

It is certified that error appears in the above-identified patent and that said Letters Patent is hereby corrected as shown below:

Column 5, line 28, change "socalled" to -- so-called --.

Column 9, line 38, change "dummy-cell capacitor" to -- dummy-cell-capacitor --; line 60, change "dummy-cell capacitor" to -- dummy-cell-capacitor --.

Column 10, line 22, change "dummy-cell capacitor" to -- dummy-cell-capacitor --.

Signed and Sealed this

Sixteenth Day of October 1984

[SEAL]

Attest:

GERALD J. MOSSINGHOFF

Attesting Officer

Commissioner of Patents and Trademarks